United States Patent
Pandey et al.

(10) Patent No.: US 10,895,812 B2
(45) Date of Patent: Jan. 19, 2021

(54) METROLOGY APPARATUS, LITHOGRAPHIC SYSTEM, AND METHOD OF MEASURING A STRUCTURE

(71) Applicant: ASML Netherlands B.V., Veldhoven (NL)

(72) Inventors: Nitesh Pandey, Eindhoven (NL); Armand Eugene Albert Koolen, Nuth (NL)

(73) Assignee: ASML Netherlands B.V., Veldhoven (NL)

( * ) Notice: Subject to any disclaimer, the term of this patent is extended or adjusted under 35 U.S.C. 154(b) by 85 days.

(21) Appl. No.: 15/833,130

(22) Filed: Dec. 6, 2017

(65) Prior Publication Data
US 2018/0173111 A1  Jun. 21, 2018

(30) Foreign Application Priority Data
Dec. 8, 2016  (EP) .................................. 16202927

(51) Int. Cl.
*G03F 7/20*  (2006.01)
*G03F 9/00*  (2006.01)

(52) U.S. Cl.
CPC ........ *G03F 7/70633* (2013.01); *G03F 7/7085* (2013.01); *G03F 7/70625* (2013.01); *G03F 9/7088* (2013.01)

(58) Field of Classification Search
CPC . H01L 21/681; H01L 21/682; G03F 7/70133; G03F 7/70208; G03F 7/70575;
(Continued)

(56) References Cited

U.S. PATENT DOCUMENTS 7,155,354 B1 * 12/2006 Mooney .................... G01J 3/02
702/65
2004/0235205 A1   11/2004 Levy et al.
(Continued)

FOREIGN PATENT DOCUMENTS

WO   WO 2009/078708 A1   6/2009
WO   WO 2009/106279 A1   9/2009
WO   WO 2015/039031 A1   3/2015

OTHER PUBLICATIONS

International Search Report and Written Opinion of the International Searching Authority directed to related International Patent Application No. PCT/EP2017/079491, dated Jan. 26, 2018; 14 pages.
(Continued)

*Primary Examiner* — Christina A Riddle
(74) *Attorney, Agent, or Firm* — Sterne, Kessler, Goldstein & Fox P.L.L.C.

(57) ABSTRACT

Metrology apparatus and methods for measuring a structure formed on a substrate by a lithographic process are disclosed. In one arrangement an optical system illuminates the structure with radiation and detects radiation scattered by the structure. The optical system comprises a first dispersive element. The first dispersive element spectrally disperses scattered radiation exclusively from a first portion of a pupil plane field distribution along a first dispersion direction. A second dispersive element, separated from the first dispersive element, spectrally disperses scattered radiation exclusively from a second portion of the pupil plane field distribution, different from the first portion of the pupil plane field distribution, along a second dispersion direction.

20 Claims, 12 Drawing Sheets

(58) Field of Classification Search
CPC .......... G03F 7/70566; G03F 7/70608; G03F 7/70633; G03F 7/70625; G03F 7/70666; G03F 7/70675; G03F 7/7085; G03F 9/7088; G03F 9/7007; G03F 9/7011; G03F 9/7015; G03F 9/7019
USPC .......... 355/52, 53, 55, 67–71, 72, 75, 77; 250/492.1, 492.2, 492.22; 356/399–401, 356/326, 492
See application file for complete search history.

(56) References Cited

U.S. PATENT DOCUMENTS

| | | |
|---|---|---|
| 2011/0027704 A1 | 2/2011 | Cramer et al. |
| 2011/0043791 A1 | 2/2011 | Smilde et al. |
| 2011/0310388 A1 | 12/2011 | Hill et al. |
| 2012/0242970 A1 | 9/2012 | Smilde et al. |
| 2015/0176979 A1* | 6/2015 | Mathijssen ......... G03F 7/70633 355/77 |
| 2016/0161864 A1 | 6/2016 | Middlebrooks et al. |
| 2018/0059552 A1* | 3/2018 | Pandey ............ G03F 7/70191 |

OTHER PUBLICATIONS

Bringoltz et al., "Accuracy in optical overlay metrology," Metrology, Inspection, and Process Control for Microlithogmphy XXX, Proc. of SPIE, vol. 9778, No. 97781H, 2016; pp. 1-19.

International Preliminary Report on Patentability directed to related International Patent Application No. PCT/EP2017/079491, dated Jun. 11, 2019; 7 pages.

\* cited by examiner

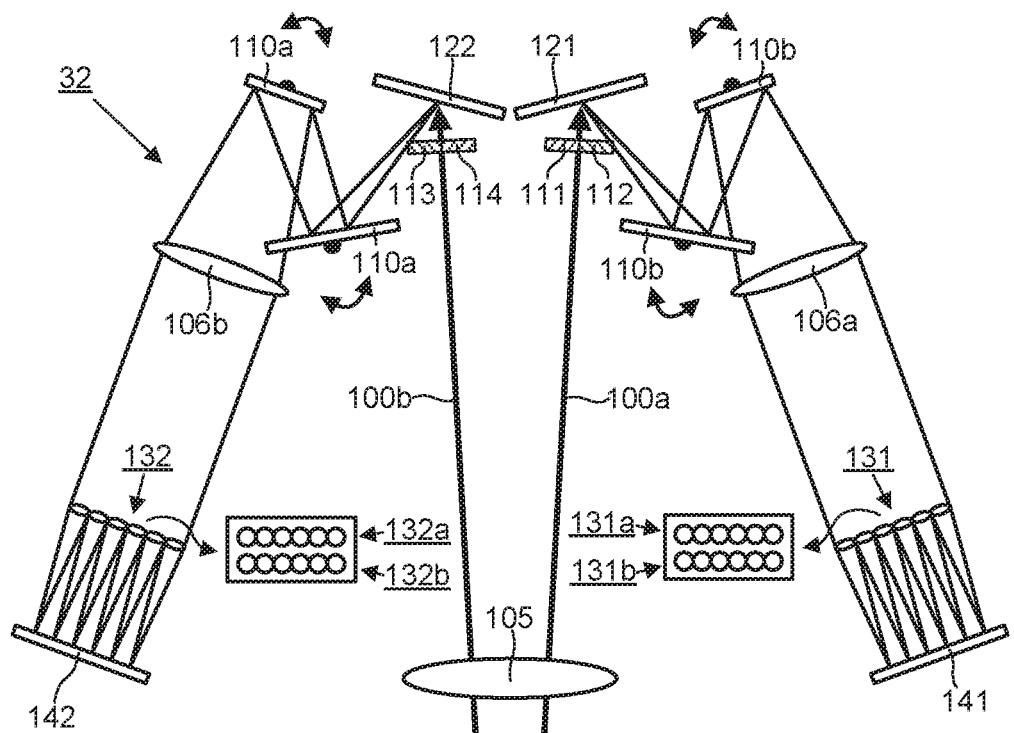

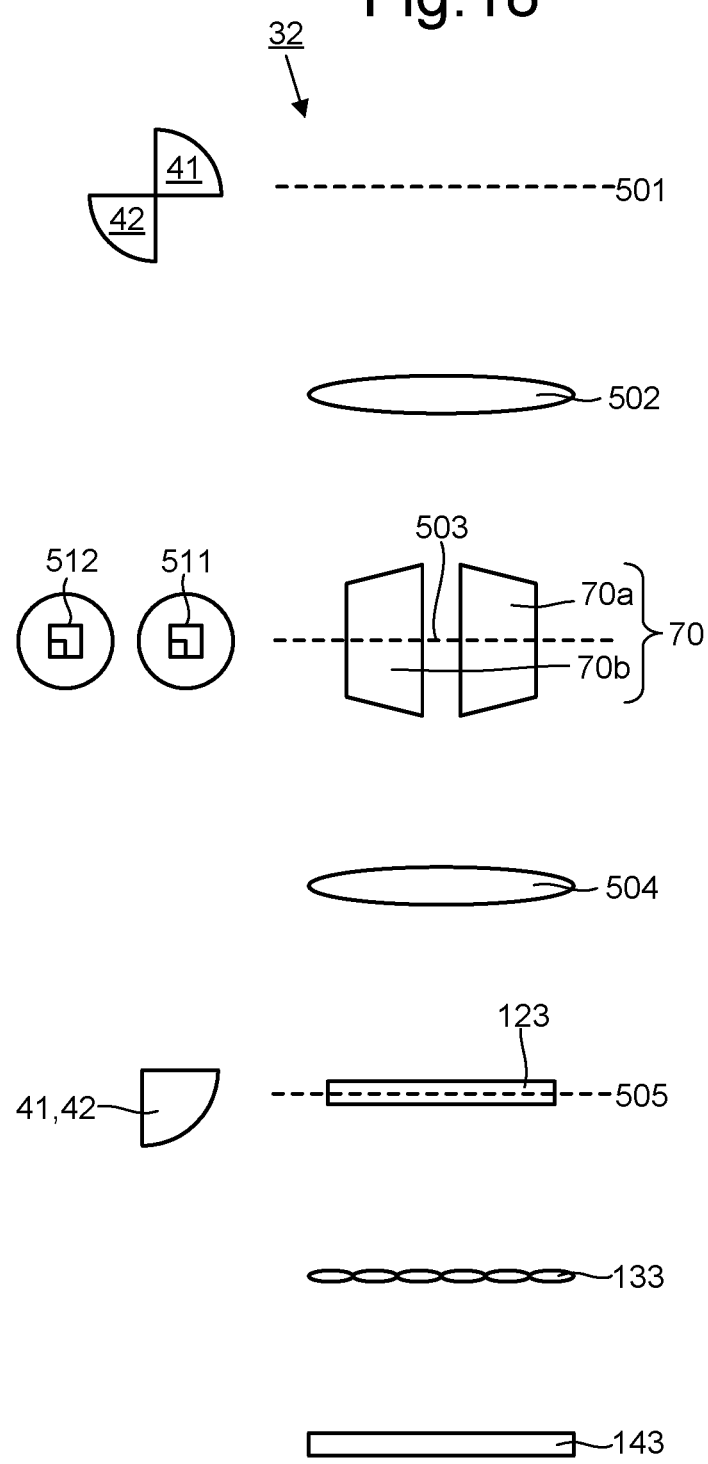

METROLOGY APPARATUS, LITHOGRAPHIC SYSTEM, AND METHOD OF MEASURING A STRUCTURE

FIELD

The present invention relates to a metrology apparatus for measuring a structure formed on a substrate by a lithographic process, a lithographic system, and a method of measuring a structure formed on a substrate by a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^4$ and the $+1^4$ diffraction order intensities. The intensity asymmetry, a comparison of these diffraction order intensities, for a given overlay target provides a measurement of target asymmetry; that is, asymmetry in the target. This asymmetry in the overlay target can be used as an indicator of overlay error (undesired misalignment of two layers).

Metrology apparatuses, when performing such dark field scatterometry, presently can perform measurements using measurement radiation of a single wavelength at any one time. However, different targets in different layers may show different behavior to different wavelength measurement radiation, which can result in variable measurement quality. Variations as a function of wavelength may also arise due to processing induced changes to the target structure. For example, semiconductor manufacturing processes such as Chemical Mechanical Planarization etching and non-uniformity of layer thicknesses and thickness variations over the surface of the wafer during deposition change the structure of the metrology target and hence also the optimum wavelength. It is therefore desirable for measurement radiation to be individually tuned to a target and/or layer.

SUMMARY

It is desirable to provide metrology apparatus and methods that allow high quality measurements to be performed efficiently.

According to an aspect of the invention, there is provided a metrology apparatus for measuring a structure formed on a substrate by a lithographic process, the metrology apparatus comprising: an optical system configured to illuminate the structure with radiation and detect radiation scattered by the structure, the optical system comprising: a first dispersive element configured to spectrally disperse scattered radiation exclusively from a first portion of a pupil plane field distribution along a first dispersion direction; and a second dispersive element, separated from the first dispersive element, configured to spectrally disperse scattered radiation exclusively from a second portion of the pupil plane field distribution, different from the first portion of the pupil plane field distribution, along a second dispersion direction.

According to an aspect of the invention, there is provided a metrology apparatus for measuring a structure formed on a substrate by a lithographic apparatus comprising:

an optical system configured to illuminate the structure with radiation and detect radiation scattered by the structure, the optical system comprising:

a beam rotation device configured to rotate at least a portion of a beam of the scattered radiation between a first pupil plane and a second pupil plane, the rotation being such that: a first pupil plane field distribution in the first pupil plane comprises a first portion and a second portion, wherein the first portion is non-overlapping with the second portion and the first portion has the same shape and size as the second portion; and a second pupil plane field distribution in the second pupil plane comprises a portion having the same shape and size as the first portion of the first pupil plane field distribution, wherein all of the radiation from the first portion and the second portion of the first pupil plane field distribution passes through said portion of the second pupil plane field distribution.

According to an aspect of the invention, there is provided a method of measuring a structure formed on a substrate by a lithographic process, comprising: illuminating the structure with radiation to produce scattered radiation from the structure; using a first dispersive element to spectrally disperse scattered radiation exclusively from a first portion of a pupil plane field distribution along a first dispersion direction; and using a second dispersive element, separated from the first dispersive element, to spectrally disperse scattered radiation exclusively from a second portion of the pupil plane field distribution, different from the first portion of the pupil plane field distribution, along a second dispersion direction; and detecting radiation from the dispersed first portions of the pupil plane field distribution and from the dispersed second portions of the pupil plane field distribution.

According to an aspect of the invention, there is provided a method of measuring a structure formed on a substrate by a lithographic apparatus comprising: illuminating the structure with radiation to produce scattered radiation from the structure; rotating at least a portion of a beam of the scattered radiation between a first pupil plane and a second pupil plane, the rotation being such that: a first pupil plane field distribution in the first pupil plane comprises a first portion and a second portion, wherein the first portion is non-overlapping with the second portion and the first portion has the same shape and size as the second portion; and a second pupil plane field distribution in the second pupil plane comprises a portion having the same shape and size as the first portion of the first pupil plane field distribution, wherein all of the radiation from the first portion and the second portion of the first pupil plane field distribution passes through said portion of the second pupil plane field distribution.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 (b) a detail of diffraction spectrum of a target grating for a given direction of illumination; FIG. 3 (c) a depiction of a known form of multiple grating target and an outline of a measurement spot on a substrate; and FIG. 3 (d) a depiction of an image of the target of FIG. 3(c) obtained in the scatterometer of FIG. 3(a)

FIGS. 8(a)-8(c) depict a multispectral unit having reflective dispersive elements;

FIG. 18 depicts an alternative multispectral unit in which different portions of the pupil plane field distribution are rotated so that they overlap with each other when performing the dispersion.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
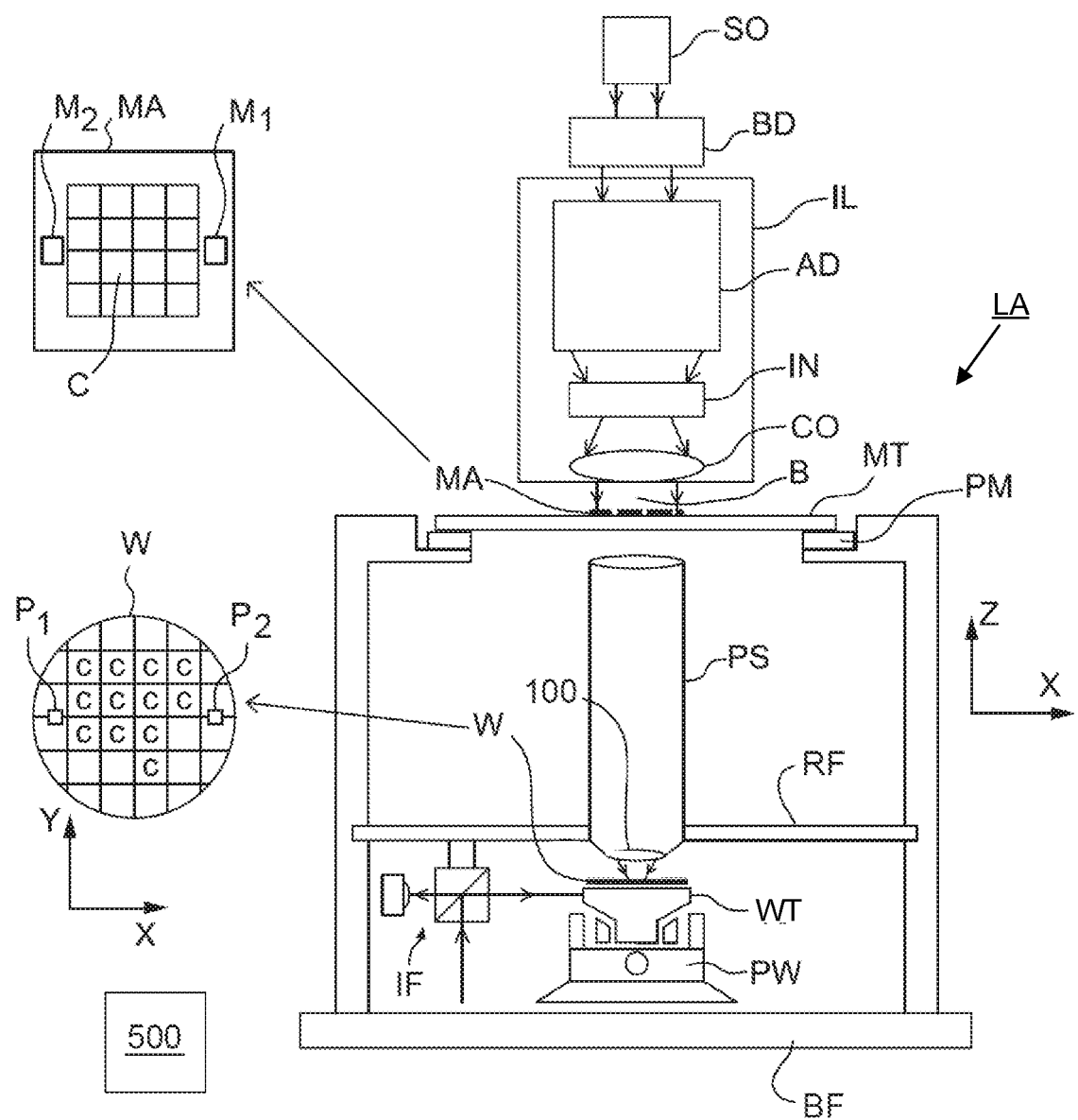
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
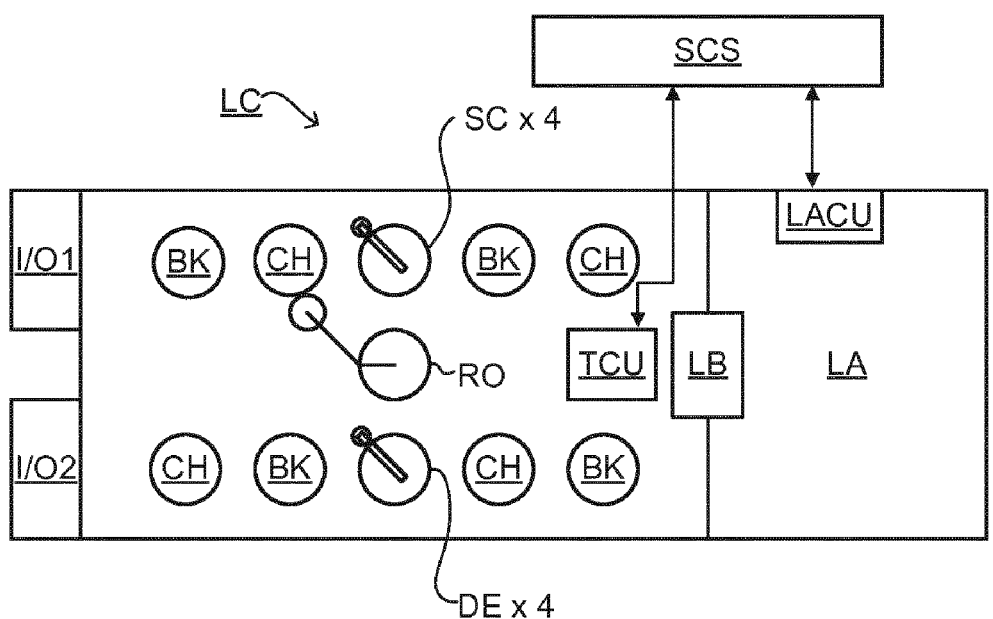
FIG. 2 depicts a lithographic cell or cluster.

As shown in FIG. 2 the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

A metrology apparatus is used to determine the properties of the substrates, and in particular, how the properties of different substrates or different layers of the same substrate vary from layer to layer. The metrology apparatus may be integrated into the lithographic apparatus LA or the lithocell LC or may be a stand-alone device. To enable most rapid measurements, it is desirable that the metrology apparatus measure properties in the exposed resist layer immediately after the exposure. However, the latent image in the resist has a very low contrast, as in there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 3A:
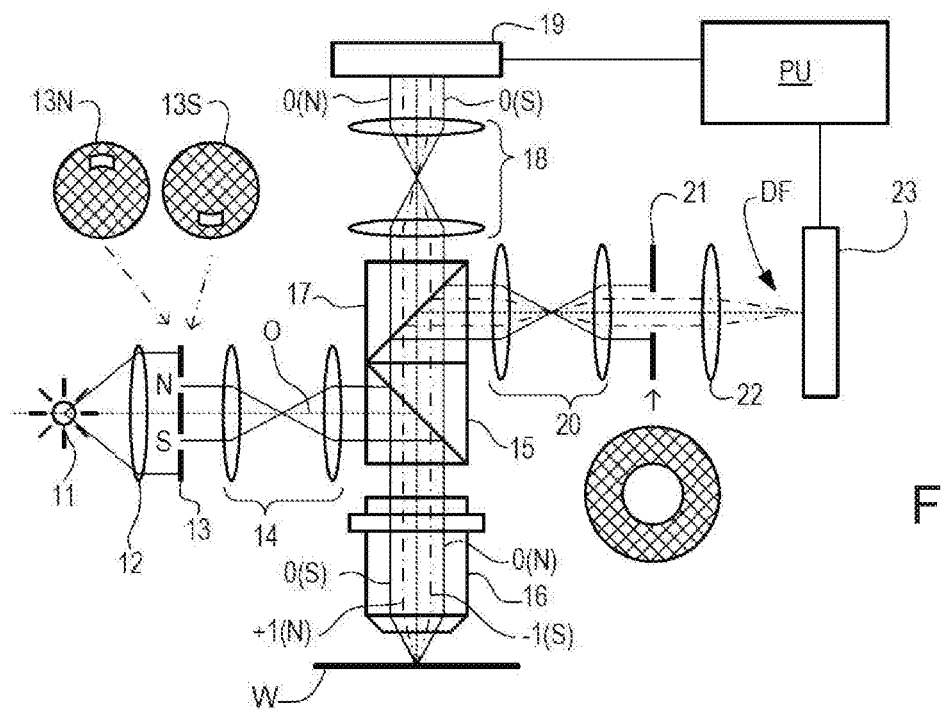
FIGS. 3(a)-3(d) comprise FIG. 3(a) a schematic diagram of a dark field scatterometer for use in measuring targets using a first pair of illumination apertures.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figure 3B:
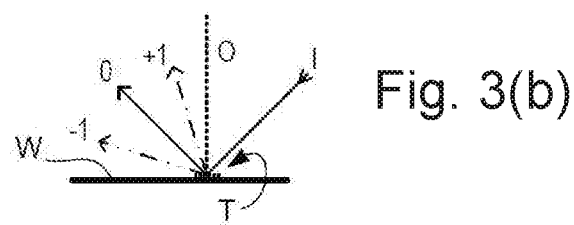

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line O) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. The use of these, and numerous other variations and applications of the apparatus are described in prior published applications, mentioned above.

Figure 3C:
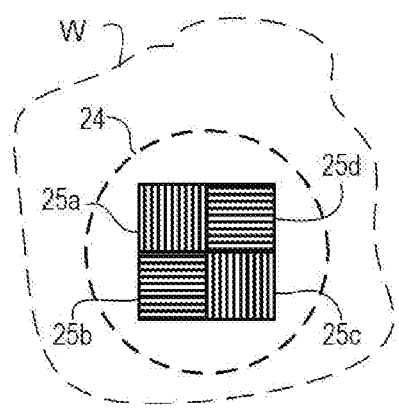

FIG. 3(c) depicts a (composite) target formed on a substrate according to known practice. The target in this example comprises four gratings 25a to 25d positioned closely together so that they will all be within a measurement scene or measurement spot 24 formed by the metrology radiation illumination beam of the metrology apparatus. The four gratings thus are all simultaneously illuminated and simultaneously imaged on sensors 19 and 23. In an example dedicated to measurement of overlay, gratings 25a to 25d are themselves composite gratings formed by overlying gratings that are patterned in different layers of the semi-conductor device formed on substrate W. Gratings 25a to 25d may have differently biased overlay offsets (deliberate mismatch between layers) in order to facilitate measurement of overlay between the layers in which the different parts of the composite gratings are formed. Such techniques are well known to the skilled person and will not be described further. Gratings 25a to 25d may also differ in their orientation, as shown, so as to diffract incoming radiation in X and Y directions. In one example, gratings 25a and 25c are X-direction gratings with biases of the +d, −d, respectively. Gratings 25b and 25d are Y-direction gratings with offsets +d and −d respectively. Separate images of these gratings can be identified in the image captured by sensor 23. This is only one example of a target. A target may comprise more or fewer than four gratings, or only a single grating.

Figure 3D:
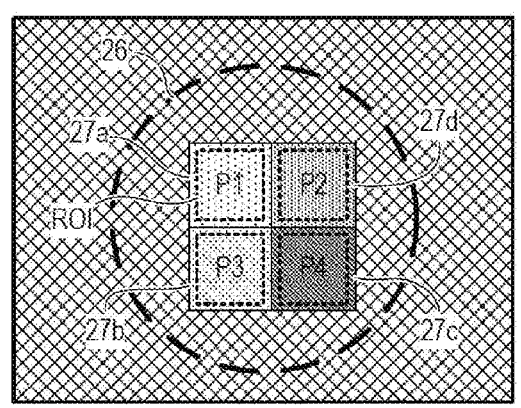

FIG. 3(d) shows an example of an image that may be formed on and detected by the sensor 23, using the target of FIG. 3(c) in the apparatus of FIG. 3(a). While the pupil plane image sensor 19 cannot resolve the different individual gratings 25a to 25d, the image sensor 23 can do so. The dark rectangle represents the field of the image on the sensor, within which the illuminated spot 24 on the substrate is imaged into a corresponding circular area 26. Within this, rectangular areas 27a to 27d represent the images of the small target gratings 25a to 25d. If the targets are located in product areas, product features may also be visible in the periphery of this image field. Image processor and controller PU processes these images using pattern recognition to identify the separate images 27a to 27d of gratings 25a to 25d. In this way, the images do not have to be aligned very precisely at a specific location within the sensor frame, which greatly improves throughput of the measuring apparatus as a whole.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Presently, when performing dark field measurements using the second imaging branch, the measurement radiation used comprises only a single wavelength. The optimum wavelength depends on the particular thicknesses of the thin film layers present in the target. As the layer thickness changes over the wafer, the measurement radiation needs individual tuning for individual targets. This can be done by measuring at a range of wavelengths sequentially, but this takes significant time and decreases productivity of the manufacturing process. It is always desirable to reduce measurement time to increase fabrication productivity and/or accuracy (by allowing more measurements to be made). In addition, multilayer overlay measurements are sometimes performed, where multiple targets in different layers are captured in a single image. For such multilayer measurements, optimization of wavelength for targets in different layers is not possible, and the wavelength chosen will only be a best compromise for the different targets.

Figure 4:
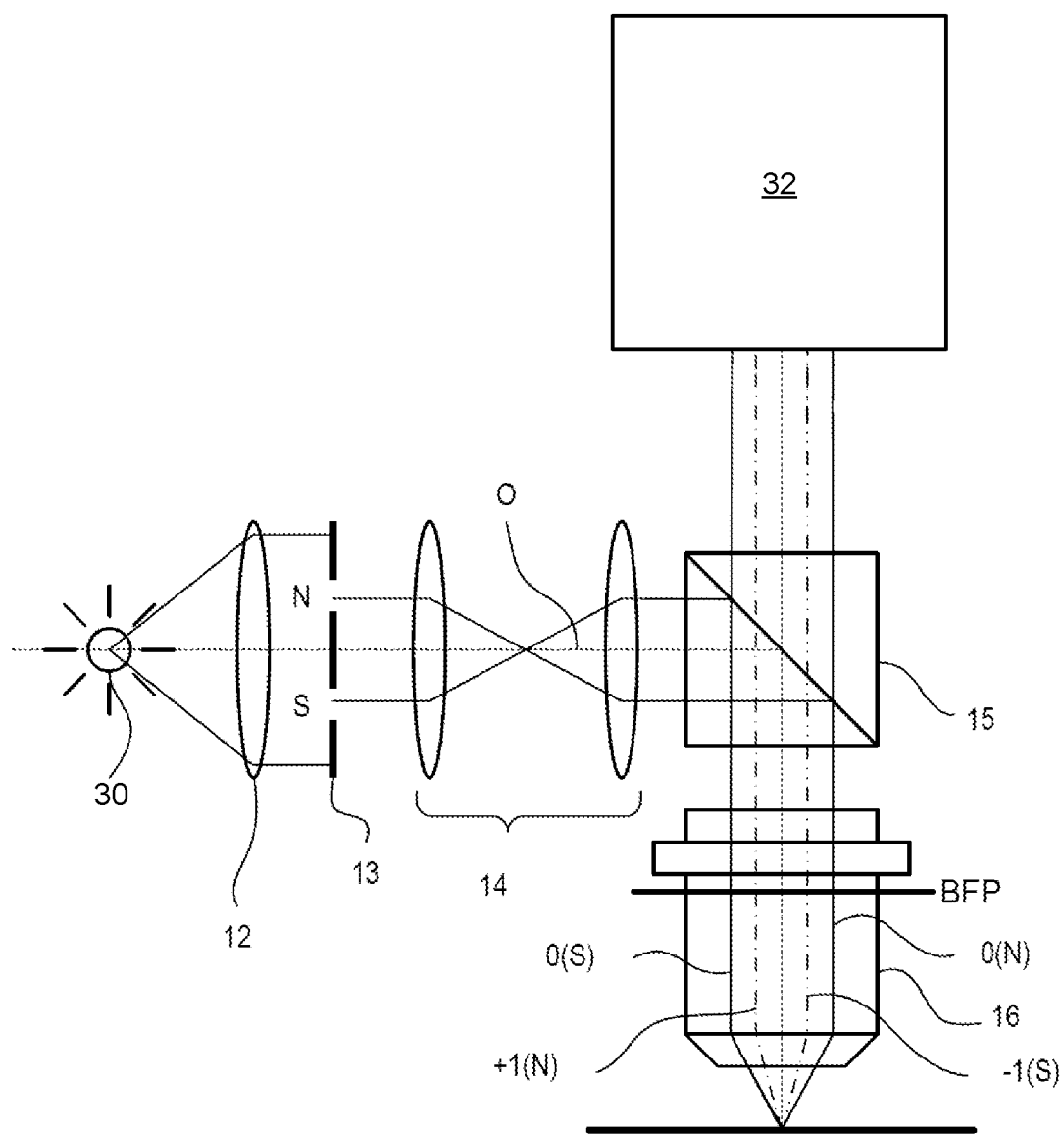
FIG. 4 depicts a metrology apparatus according to an embodiment of the invention.

FIG. 4 schematically illustrates a metrology apparatus architecture which aims to address these issues. It does this by performing measurements on a target (which may be similar to the target depicted in FIG. 3(c) for example) using multiple wavelengths in parallel. The technique used may be referred to as multispectral imaging. This allows selection of the optimal wavelength for each individual layer. Therefore, when performing a multilayer measurement for example, the wavelength can be optimized for each target without sacrificing throughput. Also, the provision of a complete spectral map of a target improves the robustness of the overlay measurement with respect to process variation.

The metrology apparatus is largely the same as that of the metrology apparatus of FIG. 3(a), and in particular the second measurement branch of this apparatus (Apparatuses according to this disclosure may optionally comprise another measurement branch in a similar manner to that illustrated in FIG. 3(a)). As such, the optical design principle between the illumination system and the sensor is largely unchanged, with the same numerals being attributed to equivalent elements.

The main differences between earlier designs and the metrology apparatus of FIG. 4 are illumination system 30 and the inclusion of a multispectral unit 32, in place of sensor 23.

The illumination system 30 provides measurement radiation comprising multiple wavelengths. The measurement radiation may comprise a continuous spectrum or multiple discrete wavelengths (or wavelength bands). In an embodiment, the measurement radiation may comprise multiple wavelengths extending from 400 nm to 900 nm.

FIG. 4 depicts an example of a metrology apparatus for measuring a structure formed on a substrate W by a lithographic process. The four gratings 25a-25d of FIG. 3(c) are examples of structures suitable for measurement by the metrology apparatus. The metrology apparatus comprises an optical system configured to illuminate the structure with radiation and detect the radiation scattered by the structure. The optical system comprises a multispectral unit 32 capable of simultaneously detecting scattered radiation in different wavelength bands. Further details about the multispectral unit 32 will be discussed below.

Figure 5:
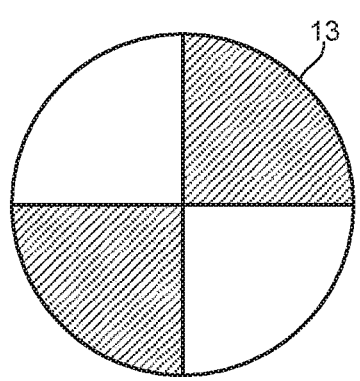
FIG. 5 depicts an example aperture plate.

FIG. 5 depicts an example aperture plate 13 suitable for use with a metrology apparatus according to embodiments. The aperture plate 13 may be positioned for example as shown in FIG. 3 in a pupil plane (in place of aperture plates 13N and 13S for example). The pupil plane may be a plane conjugate to a pupil plane of the objective lens 16. The pupil plane is a plane in which at least part of a diffraction spectrum of the target is formed (which may sometimes be referred to as a pupil plane image).

The aperture plate 13 of FIG. 5 allows radiation to pass through upper left and lower right quadrants of a circular region. The aperture plate 13 blocks radiation through upper right and lower left quadrants of the circular region. The aperture plate 13 thus defines a pupil plane field distribution, at the location of the aperture plate 13, of radiation that will subsequently illuminate the target T (comprising a structure to be measured).

Figure 6:
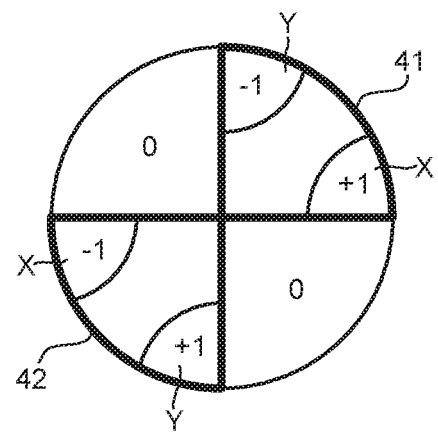
FIG. 6 depicts an example pupil plane field distribution.

FIG. 6 depicts schematically a pupil plane field distribution of radiation scattered from a structure that comprises orthogonal X-direction and Y-direction gratings (such as the target T shown in FIG. 3(c)). The pupil plane field distribution of the scattered radiation is formed in a pupil plane positioned optically downstream from the target T. This pupil plane may again be a plane conjugate to a pupil plane of the objective lens 16. Zeroth order scattering (specular reflection) causes radiation originated from either of the upper left and lower right quadrants of the pupil plane field distribution defined by the aperture plate 13 of FIG. 5 to provide contributions to the pupil plane field distribution of FIG. 6 that are also wholly within the upper left and lower right quadrants (as indicated schematically by "0" in FIG. 6). In contrast, higher than zeroth order scattering from the X-direction and Y-direction gratings will provide contributions to the pupil plane field distribution of FIG. 6 that are outside of the upper left and lower right quadrants (i.e. in the upper right and lower right quadrants, as indicated schematically in FIG. 6—note that the shapes of +1 and −1 regions are not intended to represent the exact shapes of these regions in practice, which may differ from those shown). To measure the higher than zeroth order scattered radiation with high sensitivity, an aperture stop may be provided in the pupil plane of FIG. 6 that blocks light in the upper left and lower right quadrants (i.e. the zeroth order scattered radiation). In this case, as labeled in FIG. 6, the pupil plane field distribution contributing to a detection signal downstream would comprise a first portion 41 (the upper right quadrant in FIG. 6; surrounding by a bold line for clarity) and a second portion 42 (the lower left quadrant in FIG. 6; also surrounded by a bold line for clarity).

Figure 7A:
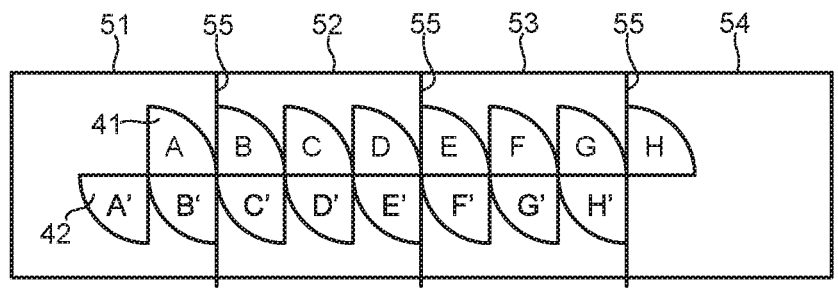
FIG. 7(a) depicts representative dispersed pupil plane field distributions on an array of lenses.
Figure 7B:
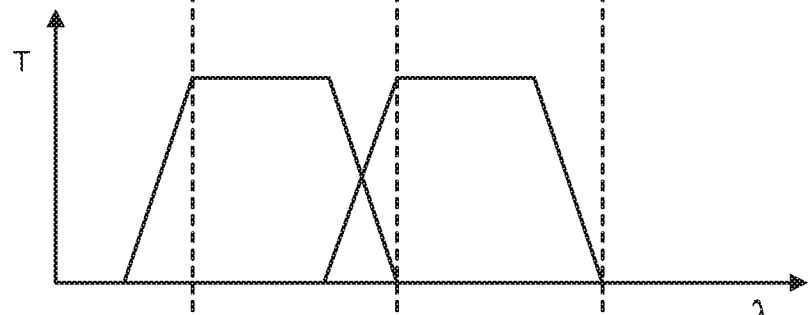
FIG. 7(b) is a graph showing transmittance (vertical axis) of a first portion of the pupil plane field distribution as a function of wavelength (horizontal axis) for different lenses.
Figure 7C:
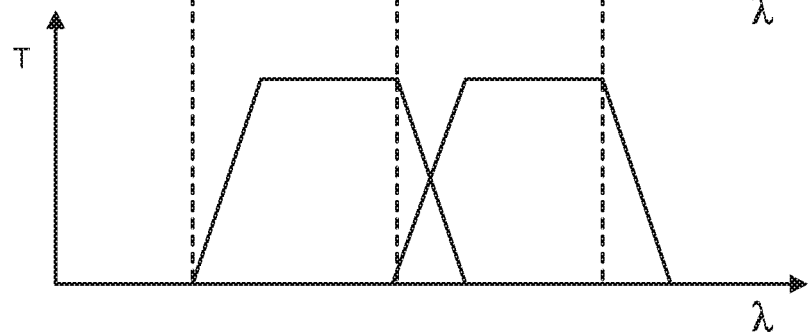
FIG. 7(c) is a graph showing transmittance (vertical axis) of a second portion of the pupil plane field distribution as a function of wavelength (horizontal axis) for different lenses.

As depicted schematically in FIG. 7, in one approach to multispectral imaging a pupil plane field distribution formed by scattered radiation is spectrally dispersed (i.e. dispersed as a function of the wavelength of the scattered radiation) over an array of lenses 51-54 (shown as squares for simplicity). The array of lenses 51-54 focuses radiation corresponding to different portions of the spectrum of the scattered radiation onto corresponding different portions of a detector. FIG. 7(a) shows representative dispersed pupil plane field distributions of the type depicted in FIG. 6 (with zeroth order blocked out) for discrete evenly spaced wavelengths (discrete wavelengths are depicted for clarity because in practice the dispersion will provide a continuum of pupil plane field distributions). Each representative pupil plane field distribution comprises a first portion 41 (marked with one of A-H) and a second portion 42 (marked with a corresponding one of A'-H'). FIG. 7(*b*) shows transmittance of the first portion 41 of the pupil plane field distribution as a function of wavelength for each of lenses 52 and 53. FIG. 7(*c*) shows transmittance T of the second portion 42 of the pupil plane field distribution as a function of wavelength for each of lenses 52 and 53.

FIGS. 7(*b*) and 7(*c*) show that when the wavelength of a given pupil plane field distribution is centered on a boundary 55 between any two of the lenses 51-54, the first portion 41 and the second portion 42 of the pupil plane field distribution are incident on different lenses. The first portion 41 contributes maximally to a lens to the right of the boundary while a contribution to that lens from the second portion 42 is zero. As wavelength increases the contribution to that lens from the first portion 41 will remain constant while a contribution from the second portion 42 will increase linearly as wavelength increases until the pupil plane field distribution has moved by half a width of the pupil plane field distribution. As the wavelength continues to increase the first portion 41 will eventually start to overlap with the next lens to the right and the contribution from the first portion 41 will then decrease linearly for one lens and rise linearly for the next lens. Thus, for each lens, and for each of the first portion 41 and the second portion 42, the transmittance T rises linearly, remains stable, and then falls linearly. Importantly, however, the transmittance T for the first portion 41 is phase shifted as a function of wavelength relative to the transmittance T of the second portion 42. The magnitude of the phase shift in this example is equal to the wavelength range corresponding to the movement of the pupil plane field distribution by half a width of the pupil plane field distribution).

The phase shift between the first portion 41 and the second portion 42 in the dispersed pupil plane field distributions causes undesirable TIS (tool induced shift) error in measurements using the dispersed pupil plane field distributions. TIS errors could be reduced by not using wavelengths which correspond to the regions of rising and falling T in FIGS. 7(*b*) and 7(*c*) (i.e. where the pupil plane field distribution overlaps two different lenses). However, this means that significant portions of the spectrum of interest are not available at the detector.

Embodiments described below adopt a different approach which reduces or avoids TIS error with minimal or no loss of radiation from the spectrum of interest. The embodiments may be implemented using a metrology apparatus as described above with reference to FIGS. 3 and 4, in which a multispectral unit 32 is configured to operate as described below with reference to FIGS. 8-18.

In an embodiment, the multispectral unit 32 comprises a first dispersive element 121. The first dispersive element 121 spectrally disperses scattered radiation exclusively from a first portion 41 of a pupil plane field distribution along a first dispersion direction 56 (shown in FIGS. 10 and 12). The multispectral unit 32 further comprises a second dispersive element 122. The second dispersive element 122 is separated from (e.g. spaced apart from) the first dispersive element 121. The second dispersive element 122 spectrally disperses scattered radiation exclusively from a second portion 42 of the pupil plane field distribution along a second dispersion direction 57 (shown in FIGS. 10 and 12). In an embodiment, the first dispersive element 121 spectrally disperses all of the radiation from the first portion 41 and no radiation from the second portion 42, and the second dispersive element 122 spectrally dispersed all of the radiation from the second portion 42 and no radiation from the first portion 41.

The first portion 41 may comprise a quadrant of a circular region, as depicted in FIG. 6 for example. In such an embodiment, the second portion 42 may comprise a different quadrant, for example a diametrically opposite quadrant of the circular region. The first portion 41 is different to the second portion 42. In an embodiment, the first portion 41 does not overlap with the second portion 42. In an embodiment, the first portion 41 and the second portion 42 have the same size as each other, have the same shape as each other, or have the same size and the same shape as each other.

The first dispersive element 121 and the second dispersive element 122 may each comprise any element capable of changing a direction of propagation of radiation in a manner dependent on the wavelength of the radiation. In an embodiment, either or both of the first dispersive element 121 and the second dispersive element 122 comprises a diffraction grating or prism. Either or both of the first dispersive element 121 and the second dispersive element 122 may be reflective (as in FIG. 8 described below) or transmissive (as in FIG. 9 described below).

In contrast to the approach described above in FIG. 7, where all of the pupil plane field distribution is dispersed together as a unit, the provision of the first and second dispersive elements 121 and 122 allows different portions of the pupil plane field distribution to be dispersed independently of each other. This enhanced flexibility makes it possible to process the scattered radiation in new ways. One desirable outcome is that the difference in lens transmittance T between different portions of the pupil plane field distribution (discussed above with reference to FIG. 7) can be reduced or avoided, thereby reducing or avoiding TIS error.

Figure 9:
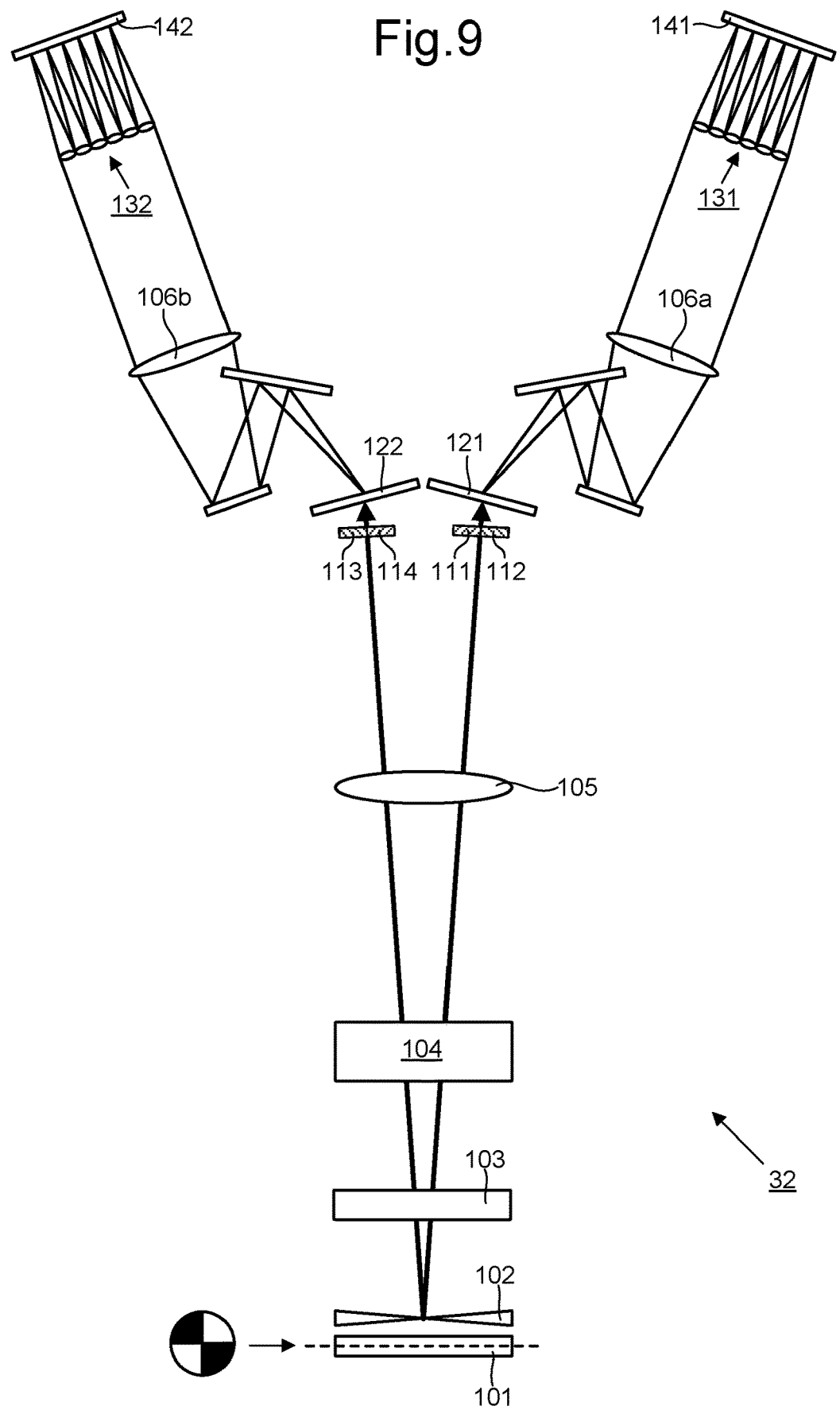
FIG. 9 depicts a multispectral unit having transmissive dispersive elements.

FIGS. 8 and 9 depict multispectral units 32 which operate in the same way as each other except that the dispersive elements 121, 122 are reflective in the arrangement of FIG. 8 and transmissive in the arrangement of FIG. 9. The following description refers to components of FIG. 8 in detail, but it will be understood that the corresponding components depicted in FIG. 9 will operate in a corresponding way.

In the embodiments of FIGS. 8 and 9 (and in other embodiments), an optical wedge 102 is positioned close to a plane 101 in which a pupil plane field distribution is formed from scattered radiation entering the multispectral unit 32. The optical wedge 102 splits the radiation such that radiation corresponding to the first portion 41 of the pupil plane field distribution is directed along a first optical path 100*a* leading to the first dispersive element 121, and radiation corresponding to the second portion 42 of the pupil plane field distribution is directed along a second optical path 100*b* leading to the second dispersive element 122. The splitting of the first portion 41 and second portion 42 is depicted schematically at level (a) in FIG. 8.

The embodiments of FIGS. 8 and 9 (and other embodiments) further comprise a beam rotation device 103 that rotates the first portion 41 and the second portion 42 and is described in further detail below. This rotation is depicted schematically at level (b) in FIG. 8. A polarization dependent beam splitter 104 that splits each of the beams (along the first optical path 100*a* and the second optical path 100*b*) into two orthogonal polarizations is further provided and described in further detail below. The rotation is depicted schematically at level (c) in FIG. 8. After processing by the polarization dependent beam splitter 104, the radiation is focused onto the first dispersive element 121 and the second dispersive element 122 by lens 105. In the embodiments shown, a polarization rotation device 111-114 is provided prior to the first dispersive element 121 and the second dispersive element 122, and is described in further detail below.

In the embodiments of FIGS. 8 and 9 (and in other embodiments), the optical system of the multispectral unit 32 directs the scattered radiation from the spectrally dispersed first portions 41 onto a first array 131 of lenses, via lens 106a. The optical system further directs the scattered radiation from the spectrally dispersed second portions 42 onto a second array 132 of lenses, via lens 106b. The first array 131 of lenses is located in a plane in which the spectrally dispersed first portions 41 of the pupil plane field distribution are formed. The second array 132 of lenses is located in a plane in which the spectrally dispersed second portions 42 of the pupil plane field distribution are formed. The first array 131 of lenses focuses radiation onto a first detector 141. The second array 132 of lenses focuses radiation onto a second detector 142. In an embodiment the focused radiation from each array 131,132 forms an image corresponding to the structure being measured on the respective detector 141,142.

In an embodiment either or both of the first array 131 of lenses and the second array 132 of lenses comprises a plurality of lenses arranged in a regular 1D or 2D array. In an embodiment the lenses are nominally identical (e.g. same diameter) but may be individually adjustable to allow fine tuning of images formed by the lenses on the respect detector 141,142. For example, in an embodiment the focal length or position of each of the lenses can be individually adjusted. Lenses having individually adjustable focal length or position are well known in the art, so no further details are provided here. Fine tuning of the lenses can compensate for example for variations in the optical properties of the lens as a function of wavelength.

In an embodiment the lenses are configured to correct distortions, for example distortions introduced by the first dispersive element 121 or the second dispersive element 122. In an embodiment the lenses are configured to correct anamorphic distortions (which if not corrected would distort circular images to elliptical images). This may be achieved for example by using cylindrical lenses.

In the embodiments shown, a first optical sub-system is provided between the first dispersive element 121 and the array 131 of lenses. A second optical sub-system is provided between the second dispersive element 122 and the array 132 of lenses. In the examples of FIGS. 8 and 9, each of the first optical sub-system and the second optical sub-system comprises two adjustable (e.g. rotatably mounted) reflective elements 110a, 110b. The reflective elements 110a, 110b can be adjusted to control positioning of the dispersed first portions 41 and second portions 42 of the pupil plane field distribution on the respective arrays 131 and 132 of lenses. The reflective elements 110a, 110b may need to be adjusted for example where it is required to detect a different spectral range of pupil plane field distributions (which will be dispersed differently by the first and second dispersive elements 121, 122 and therefore require different positioning of the reflective elements 110a, 110b to achieve alignment with the arrays 131, 132 of lenses).

Figure 10:
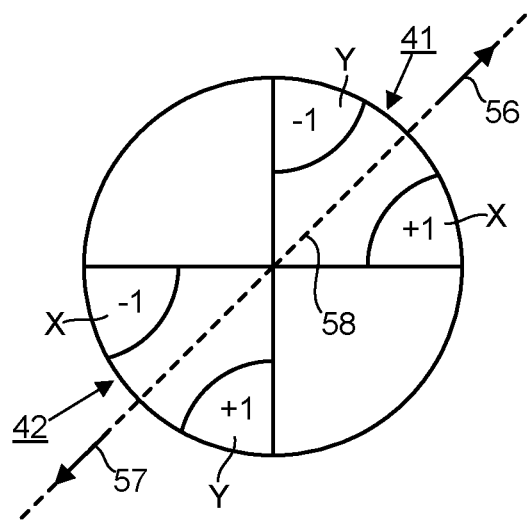
FIG. 10 depicts an example pupil plane field distribution and first and second dispersion directions.
Figure 12:
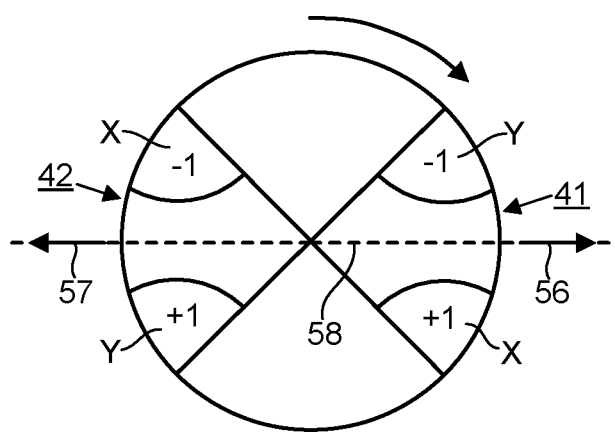
FIG. 12 depicts an example rotation of the pupil plane field distribution of FIG. 10.

In an embodiment, the first dispersion direction 56 is opposite to the second dispersion direction 57 relative to the pupil plane field distribution. Example directions are shown in FIGS. 10 and 12 relative to a pupil plane field distribution of the type shown in FIG. 6. Arranging for the first dispersion direction 56 to be opposite to the second dispersion direction 57 facilitates processing of the different portions 41, 42 of the pupil plane field distributions in an optically symmetrical manner, which reduces TIS error.

In an embodiment, the first dispersion direction 56 and the second dispersion direction 57 are parallel to a line of mirror symmetry 58 of the first portion 41 and to a line of mirror symmetry 58 of the second portion 42. In the examples of FIGS. 10 and 12, the line of mirror symmetry 58 of the first portion 41 is coincident with the line of mirror symmetry 58 of the second portion 42 (a diagonal line in FIG. 10 and a horizontal line in FIG. 12). Dispersing the first portion 41 and the second portion 42 along lines of mirror symmetry 58 reduces TIS error by reducing the difference between dispersion of corresponding different portions of the pupil plane field distribution.

In an embodiment, the first portion 41 and the second portion 42 of the pupil plane field distribution comprise non-overlapping regions having the same shape and size in the pupil plane. In the particular examples of FIGS. 10 and 12, the non-overlapping regions are diametrically opposite quadrants of a circle.

In an embodiment, in a case where the structure being measured comprises a grating (e.g. an X-direction grating and a Y-direction grating), the first portion 41 of the pupil plane field distribution and the second portion 42 of the pupil plane field distribution respectively contain equal and opposite diffraction orders from the grating. In the examples of FIGS. 6, 10 and 12, in which the pupil plane field distribution is formed from first order diffraction from a structure comprising an X-direction grating and a Y-direction grating, the first portion 41 of the pupil plane field distribution comprises +1 order diffraction from the X-direction grating and −1 order diffraction from the Y-direction grating. The second portion 42 of the pupil plane field distribution comprises +1 order diffraction from the Y-direction grating and −1 order diffraction from the X-direction grating.

Figure 11:
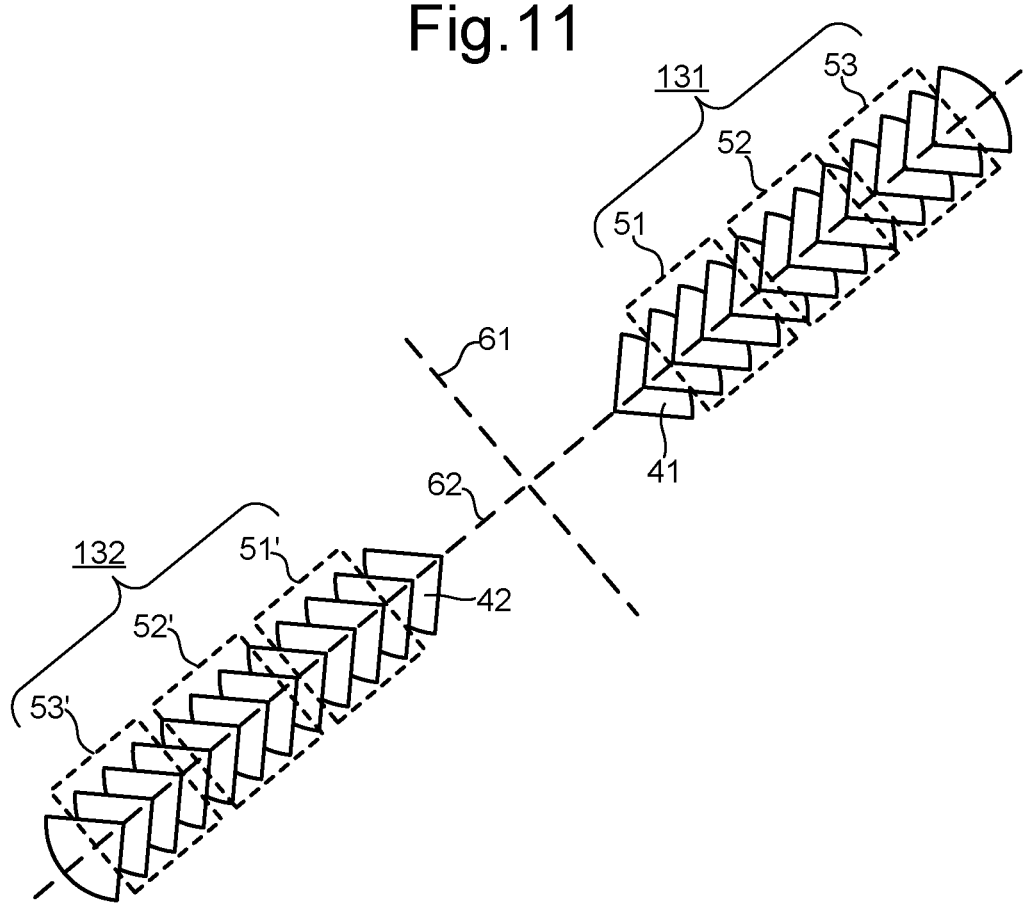
FIG. 11 depicts example dispersed pupil plane field distributions of the first portion onto a first array of lenses and of the second portion onto a second array of lenses.

In an embodiment, the first dispersion element 121 and the second dispersion element 122 are oriented so that the first portion 41 and the second portion 42 can be dispersed along the respective first dispersion direction 56 and second dispersion direction 57 without any rotation of the pupil plane field distribution prior to the scattered radiation reaching the first dispersion element 121 and the second dispersion element 122. Thus, dispersion as illustrated in FIG. 10 is achieved directly. FIG. 11 depicts example dispersed pupil plane field distributions of the first portion 41 onto a first array 131 of lenses 51-53 and of the second portion 42 onto a second array 132 of lenses 51'-53'.

In an alternative embodiment, as exemplified in FIGS. 8 and 9, the optical system comprises a beam rotation device 103 that rotates the pupil plane field distribution by a predetermined angle before directing radiation from the first portion 41 of the pupil plane field distribution onto the first dispersive element 121 and before directing radiation from the second portion 42 of the pupil plane field distribution onto the second dispersive element 122. The beam rotation device 103 may be implemented for example using a Dove prism (a known prism shaped from a truncated right-angle prism). Rotating the pupil plane field distribution makes it possible for structures having different orientations to be measured efficiently without having to perform fundamental repositioning of downstream optical elements such as the first dispersive element 121 and the second dispersive element 122. The predetermined angle can thus be chosen for example such that the first dispersion direction 56 and the second dispersion direction 57 (defined by the respective orientations of the first dispersive element 121 and the second dispersive element 122) are parallel to a line of mirror symmetry 58 of the first portion 41 and to a line of mirror symmetry 58 of the second portion 42. An example rotation is depicted schematically in FIG. 12. The rotation in this example comprises a clockwise rotation of 45 degrees so that the line of mirror symmetry 58 is horizontal and aligned with dispersion directions 56 and 57 provided by the first dispersive element 121 and the second dispersive element 122 of this example.

Figure 13:
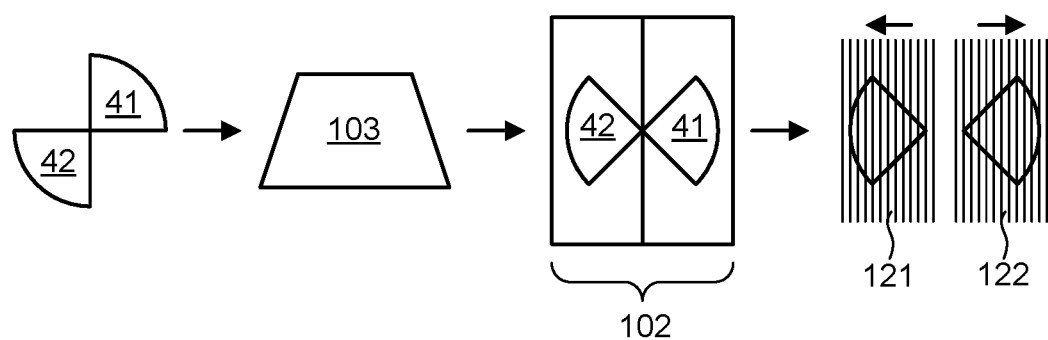
FIG. 13 schematically depicts an alternative ordering of optical components of a multispectral unit, in which an optical wedge is positioned after a beam rotation device.

In the embodiments of FIGS. 8 and 9, the beam rotation device 103 is positioned after the optical wedge 102. FIG. 13 depicts an alternative scheme in which the optical wedge 102 is positioned after the beam rotation device. Thus, the first portion 41 and the second portion 42 are rotated together by beam rotation device 103 and then separated by optical wedge 102 and directed onto the separated first dispersive element 121 and second dispersive element 122.

In an embodiment, as illustrated in FIG. 11, the first dispersive element 121 and the first array 131 of lenses are arranged relative to the second dispersive element 122 and the second array 132 of lenses such that the spectrally dispersed first portions 41 of the pupil plane field distribution formed in the plane of the first array 131 of lenses are mirror symmetric about two orthogonal planes of symmetry 61 and 62 with respect to the spectrally dispersed second portions 42 of the pupil plane field distribution formed in the plane of the second array 132 of lenses. This symmetry ensures that scattered radiation from equal and opposite diffraction orders propagates through symmetric optical paths before being detected by the respective detectors 141, 142, thereby reducing or avoiding TIS error.

Figures 14A, 14B, 14C:
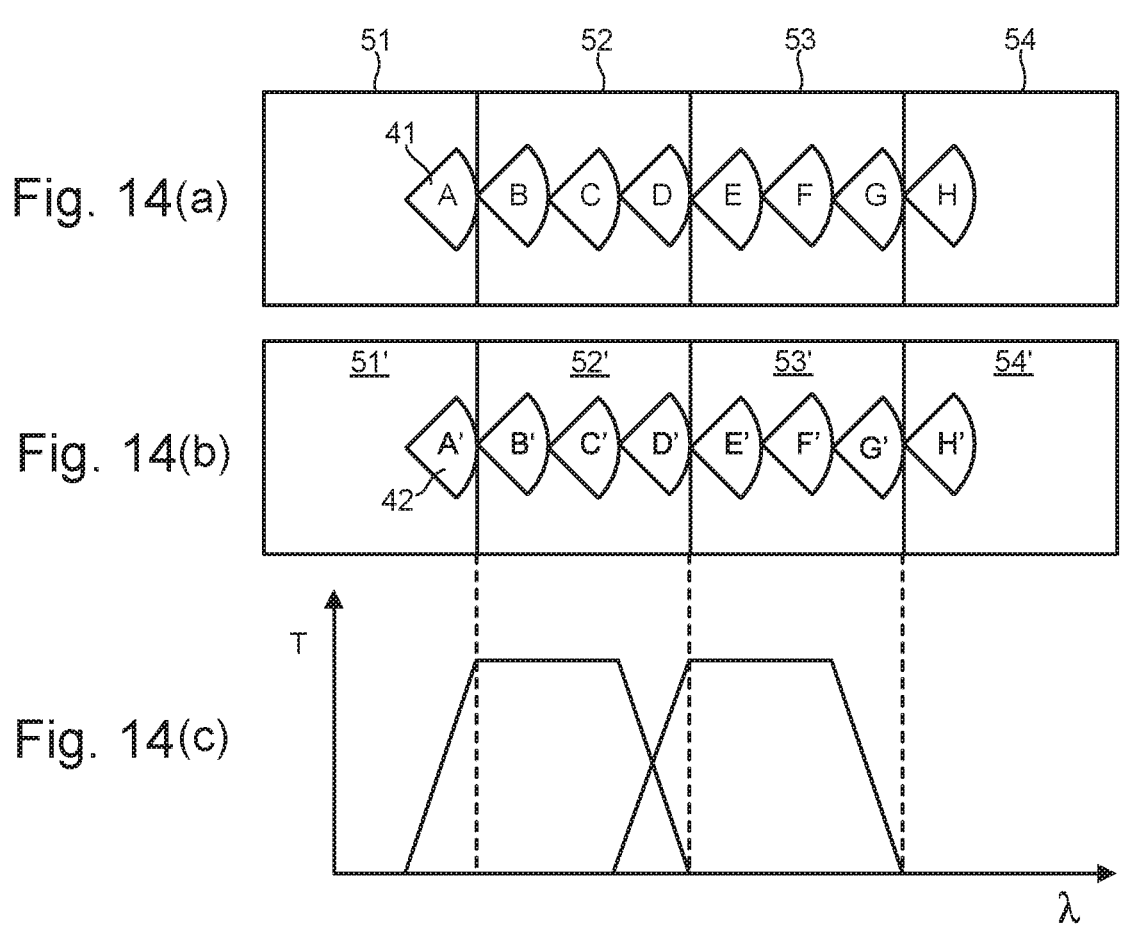
FIG. 14(a) depicts representative dispersed first portions of pupil plane field distributions on a first array of lenses.
FIG. 14(b) depicts representative dispersed second portions of pupil plane field distributions on a second array of lenses.
FIG. 14(c) is a graph showing transmittance (vertical axis) of the first portions and second portions as a function of wavelength (horizontal axis) for different lenses.

The symmetric dispersion achievable using embodiments is presented in FIG. 14 and can be compared with the non-symmetric dispersion shown in FIG. 7. FIG. 14(a) shows representative dispersed first portions 41 of pupil plane field distributions on lenses 51-54 of the first array 131 of lenses. FIG. 14(b) shows representative dispersed second portions 42 of pupil plane field distributions on corresponding lenses 51'-54' of the second array 132 of lenses. As in FIG. 7(a), the first portions 41 are labeled A-H and each corresponds to (i.e. originates from a pupil plane distribution formed from radiation having the same wavelength as) a second portion 42 labeled with the same letter A'-H'. FIG. 14(c) shows transmittance T of the first portions 41 and second portions 42 as a function of wavelength for each of the lenses 52-53 and 52'-53'. Only one graph is shown for FIG. 14(c) because, unlike in the arrangement of FIG. 7, the transmittance T for the first portions 41 exactly overlies the transmittance T for the second portions 42. The phase shift discussed above with reference to FIG. 7 does not exist and there is no corresponding contribution to TIS error.

In an embodiment, the multispectral unit 32 further comprises a polarization dependent beam splitter 104. As depicted at level (c) in FIG. 8, for example, the polarization dependent beam splitter 104 splits scattered radiation from the first portion 41 into radiation having a first polarization 41a and radiation having a second polarization 41b. The polarization dependent beam splitter 104 further splits scattered radiation from the second portion 42 into radiation having a first polarization 42a and radiation having a second polarization 42b. In an embodiment, the polarization dependent beam splitter 104 comprises a Wollaston prism (a known device that separates light into two orthogonal linearly polarized outgoing beams).

In an embodiment, as depicted in FIG. 8, radiation from spectrally dispersed first portions of the pupil plane field distribution having the first polarization 41a are directed onto a first sub-portion 131a of the first array 131 of lenses. Radiation from spectrally dispersed first portions of the pupil plane field distribution having the second polarization 41b are directed onto a second sub-portion 131b of the first array 131 of lenses. Radiation from spectrally dispersed second portions of the pupil plane field distribution having the first polarization 42a are directed onto a first sub-portion 132a of the second array 132 of lenses. Radiation from spectrally dispersed second portions of the pupil plane field distribution having the second polarization 42b are directed onto a second sub-portion 132b of the second array 132 of lenses. Thus, instead of two sets of dispersed portions of the pupil plane field distribution being incident on the lenses, as depicted in FIG. 11, four sets of dispersed portions are incident on the lenses. Dispersed portions from each of the two different polarizations are parallel to each other.

In an embodiment, a polarization rotation device 111-114 is provided that rotates the polarization of radiation incident on the first dispersive element 121 so that the polarization is aligned with a direction of highest diffraction efficiency of the first dispersive element 121. The polarization rotation device 111-114 further rotates the polarization of radiation incident on the second dispersive element 122 so that the polarization is aligned with a direction of highest diffraction efficiency of the second dispersive element 122. Diffraction efficiency is thereby improved and is the same for both polarization components. In an embodiment, the rotation applied to the polarization of radiation incident on the first dispersive element 121 is the same (e.g. 45 degrees rotation) as the rotation applied to the polarization of radiation incident on the second dispersive element 122, thereby ensuring symmetrical optical processing of the two polarization components. Various known optical components can be used to rotate the polarization, including for example a prism rotator (e.g. zero order wave plates, double Fresnel rhomb, broadband prismatic rotator), birefringent rotator, or Faraday rotator.

In the embodiment of FIGS. 8 and 9, the polarization rotation device 111-114 comprises four elements: a first polarization rotation device sub-element 111 that rotates the polarization of scattered radiation from the first portion 41 having a first polarization 41a (before rotation), a second polarization rotation device sub-element 112 that rotates scattered radiation from the first portion 41 having a second polarization 41b, a third polarization rotation device sub-element 113 that rotates scattered radiation from the second portion 42 having a first polarization 42a, and a fourth polarization rotation device sub-element 114 that rotates scattered radiation from the second portion 42 having a second polarization 42b.

Figure 15:
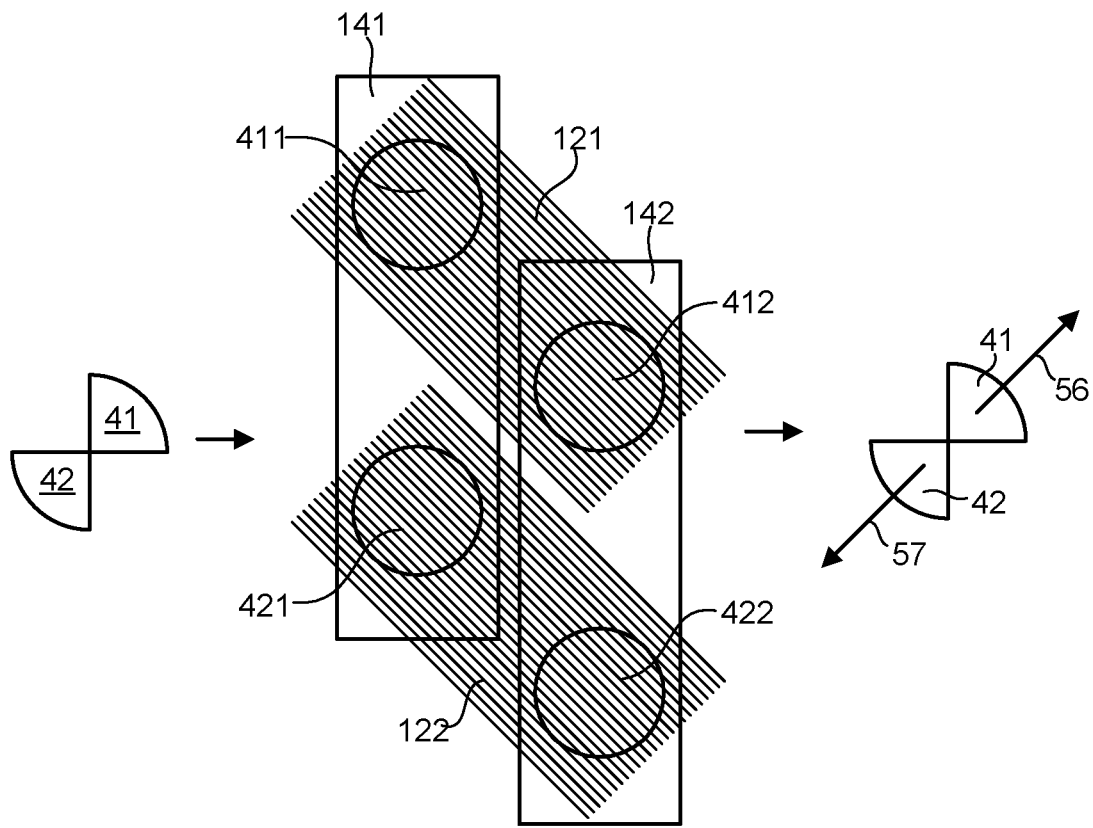
FIG. 15 schematically depict operation of a polarization rotation device having two sub-elements.
Figure 16:
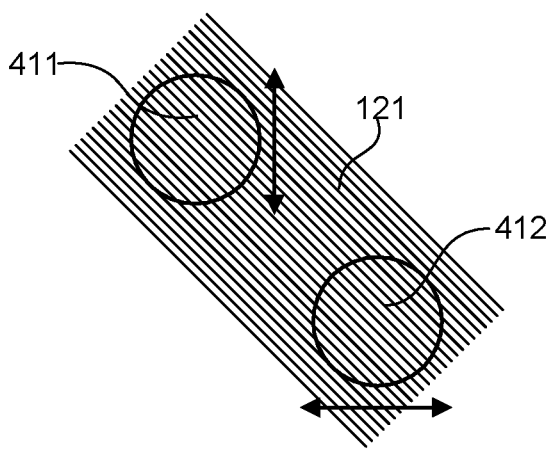
FIG. 16 depicts two different polarizations of radiation corresponding to the first portion relative to a first dispersive element prior to rotation of the polarizations by the polarization rotation device of FIG. 15.
Figure 17:
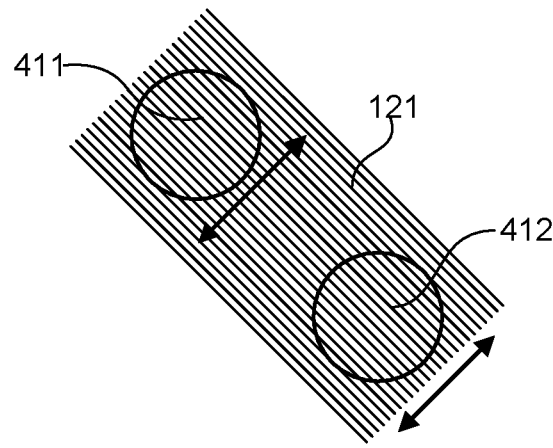
FIG. 17 depicts two different polarizations of radiation corresponding to the first portion relative to the first dispersive element after rotation of the polarizations by the polarization rotation device of FIG. 15.

FIGS. 15-17 depicts an alternative approach in which only two polarization rotation device sub-elements 141 and 142 are required. In this embodiment, radiation from each of the two spectrally dispersed portions that have the same polarization are directed onto the same polarization device sub-element. Thus, radiation 411 from spectrally dispersed first portions having the first polarization 41a (vertical in the orientation of FIGS. 15-17) and radiation 421 from spectrally dispersed second portions having the first polarization 42a (also vertical) is incident on one and the same polarization rotation device sub-element 141. The polarization rotation device sub-element 141 rotates the polarization by 45 degrees clockwise and directs the radiation respectively onto the first and second dispersive elements 121, 122, which are angled so that the rotated polarization is orthogonal to the grating lines. The rotation is depicted in the upper parts of FIGS. 16 and 17 for radiation from the first portion 41. In a corresponding manner, radiation 412 from spectrally dispersed first portions having the second polarization 41b (horizontal in the orientation of FIGS. 15-17) and radiation 422 from spectrally dispersed second portions having the second polarization 42b (also horizontal) is incident on one and the same polarization rotation device sub-element 142. The polarization rotation device sub-element 142 rotates the polarization by 45 degrees anticlockwise and directs the radiation respectively onto the first and second dispersive elements 121, 122, which are angled so that the rotated polarization is orthogonal to the grating lines. The rotation is depicted in the lower parts of FIGS. 16 and 17 for radiation from the first portion 41.

In the above embodiments, TIS error was avoided or reduced by dispersing different portions of the pupil plane field distribution in different directions. In alternative embodiments, a similar effect can be achieved by rotating different portions of the pupil plane field distribution so that they lie over each other (i.e. occupying the same position in the pupil plane) when performing the dispersion.

In an embodiment of this type, the illumination system may be configured in any of the ways described above to illuminate the structure to be measured with radiation and to detect radiation scattered by the structure. The scattered radiation may be directed into a multispectral unit 32, an example of which is depicted schematically in FIG. 18. A beam rotation device 70 is provided that rotates at least a portion of a beam of the scattered radiation between a first pupil plane 501 (e.g. a plane where radiation enters the multispectral unit 32, the plane being conjugate to a pupil plane of an objective lens) and a second pupil plane 505 (e.g. another plane conjugate to a pupil plane of the objective lens). A first pupil plane field distribution in the first pupil plane 501 comprises a first portion 41 and a second portion 42 (depicted schematically in the inset to the left of plane 501 in FIG. 18). The first portion 41 and the second portion 42 are non-overlapping. The first portion 41 and the second portion 42 have the same shape and size. In the particular example shown, the first portion 41 and the second portion 42 comprise quadrants of a circle that are diametrically opposite to each other. The rotation provided by the beam rotation device 70 is such that a second pupil plane field distribution in the second pupil plane 505 comprises a portion 41, 42 (the lower right quadrant of a circle) having the same shape and size as each of the first portion 41 and the second portion 42 of the first pupil plane field distribution. All of the radiation from the first portion 41 and the second portion 42 of the first pupil plane field distribution passes through the single portion 41, 42 of the second pupil plane field distribution.

In an embodiment, the beam rotation device 70 rotates a first portion of the beam of scattered radiation such that the first portion 41 of the first pupil plane field distribution is rotated by a first amount (e.g. 90 degrees) in a first sense (e.g. clockwise). The beam rotation device 70 further rotates a second portion of the beam of scattered radiation such that the second portion 42 of the first pupil plane field distribution is rotated by the first amount (e.g. 90 degrees) in a second sense (e.g. anticlockwise), the second sense being opposite to the first sense. In the embodiment shown, the lenses 502 and 504 define an image plane 503. The beam rotation device 70 is provided in the image plane 503. The beam rotation device 70 comprises an element 70a (e.g. a Dove prism) that provides the rotation of the first portion of the beam of scattered radiation (corresponding to an image 511—see inset to the left of plane 503 in FIG. 18). The beam rotation device 70 further comprises an element 70b (e.g. a Dove prism) that provides the rotation of the second portion of the beam of scattered radiation (corresponding to an image 512—see inset to the left of plane 503 in FIG. 18).

Thus, radiation corresponding to the first portion 41 is processed optically in a symmetrical manner relative to the second portion 42 and brought together so as to occupy the same region in the second pupil plane field distribution (see inset to left of plane 505 in FIG. 18). A single dispersive element 123 (e.g. a grating or prism) provided in the second pupil plane 505 disperses the first and second portions 41, 42 equally, effectively providing dispersion of the first and second portions 41, 42 in opposite directions relative to the first pupil plane field distribution. The spectrally dispersed first portions 41 and the spectrally dispersed second portions 42 are directed onto a single array 133 of lenses. The array 133 of lenses focuses the radiation onto a detector 143. The spectrally dispersed first portions 41 and the spectrally dispersed second portions 42 will be incident on the array 133 of lenses at the same positions but can be made to focus onto different portions of the detector 143, thereby facilitating independent detection. For example, an optical wedge may be used to split the beam of radiation at or near the first pupil plane 501 so that radiation from the first portion 41 and the second portion 42 of the first pupil plane field distribution travel along different paths to the array 133 of lenses. Thus, while the spectrally dispersed first portions 41 and the spectrally dispersed second portions 42 are incident on the array 133 of lenses at the same positions, they will be incident from different directions (angles) and will therefore be focussed at different positions on the detector 143.

The above embodiments allow simultaneous measurement of a structure with radiation from a plurality of different wavelength bands. High quality measurements of the structure can therefore be made because the measurements are not restricting to a single wavelength band. The measurement may be made with high efficiency because it is not necessary to perform measurements using different wavelength bands at different times. Furthermore, TIS errors caused by unequal processing of different portions of the pupil plane field distribution are reduced or avoided.

The concepts described herein can be used to enable parallel readout of a multispectral measurement instead of having to select each wavelength separately and perform multiple measurements in series. Such measurements may be used, for example, in performing overlay measurements on overlay targets.

Having parallel measurements with different wavelengths make the measurements more robust. For example, better asymmetry correction can be obtained by combining multiple colors (e.g. by using blind source separation techniques, as described in U.S. application Ser. No. 14/906,896 which is incorporated herein in its entirety).

The concepts disclosed herein may find utility beyond post-lithography measurement of structures for monitoring purposes. For example, such a detector architecture may be used in future alignment sensor concepts that are based on pupil plane detection, used in lithographic apparatuses for aligning the substrate during the patterning process.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed.

The metrology apparatus can be used in a lithographic system, such as the lithographic cell LC discussed above with reference to FIG. 2. The lithographic system comprises a lithographic apparatus LA that performs a lithographic process. The lithographic apparatus may be configured to use the result of a measurement by the metrology apparatus of a structure formed by the lithographic process when performing a subsequently lithographic process, for example to improve the subsequent lithographic process.

An embodiment may include a computer program containing one or more sequences of machine-readable instructions describing methods of measuring targets on a structures and/or analyzing measurements to obtain information about a lithographic process. There may also be provided a data storage medium (e.g., semiconductor memory, magnetic or optical disk) having such a computer program stored therein. Where an existing lithography or metrology apparatus is already in production and/or in use, the invention can be implemented by the provision of updated computer program products for causing a processor to perform the methods described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

Further embodiments according to the invention are further described in below numbered clauses:

1. A metrology apparatus for measuring a structure formed on a substrate by a lithographic process, the metrology apparatus comprising:
an optical system configured to illuminate the structure with radiation and detect radiation scattered by the structure, the optical system comprising:
a first dispersive element configured to spectrally disperse scattered radiation exclusively from a first portion of a pupil plane field distribution along a first dispersion direction; and
a second dispersive element, separated from the first dispersive element, configured to spectrally disperse scattered radiation exclusively from a second portion of the pupil plane field distribution, different from the first portion of the pupil plane field distribution, along a second dispersion direction.

2. The apparatus of clause 1, wherein the first dispersion direction is opposite to the second dispersion direction relative to the pupil plane field distribution.

3. The apparatus of clause 1 or 2, wherein the first dispersion direction and the second dispersion direction are parallel to a line of mirror symmetry of the first portion and to a line of mirror symmetry of the second portion.

4. The apparatus of any preceding clause, wherein the optical system is configured to direct the scattered radiation from the spectrally dispersed first portions onto a first array of lenses and to direct the scattered radiation from the spectrally dispersed second portions onto a second array of lenses.

5. The apparatus of clause 4, wherein the first array of lenses is configured to focus radiation onto a first detector and the second array of lenses is configured to focus radiation onto a second detector.

6. The apparatus of clause 4 or 5, wherein:
the first array of lenses is located in a plane in which the spectrally dispersed first portions of the pupil plane field distribution are formed and the second array of lenses is located in a plane in which the spectrally dispersed second portions of the pupil plane field distribution are formed.

7. The apparatus of clause 6, wherein the first dispersive element and the first array of lenses are arranged relative to the second dispersive element and the second array of lenses such that the spectrally dispersed first portions of the pupil plane field distribution formed in the plane of the first array of lenses are mirror symmetric about two orthogonal planes of symmetry with the spectrally dispersed second portions of the pupil plane field distribution formed in the plane of the second array of lenses.

8. The apparatus of any preceding clause, wherein the optical system comprises a beam rotation device configured to rotate the pupil plane field distribution by a predetermined angle before directing radiation from the first portion of the pupil plane field distribution onto the first dispersive element and before directing radiation from the second portion of the pupil plane field distribution onto the second dispersive element.

9. The apparatus of clause 8, wherein the predetermined angle is such that the first dispersion direction and the second dispersion direction are parallel to a line of mirror symmetry of the first portion and to a line of mirror symmetry of the second portion.

10. The apparatus of any preceding clause, wherein the optical system is configured such that, when the structure comprises a grating, the first portion of the pupil plane field distribution and the second portion of the pupil plane field distribution respectively contain equal and opposite diffraction orders from the grating.

11. The apparatus of any preceding clause, further comprising a polarization dependent beam splitter configured to split each of scattered radiation from the first portion of the pupil plane field distribution and scattered radiation from the second portion of the pupil plane field distribution into radiation having a first polarization and radiation having a second polarization.

12. The apparatus of clause 11, wherein the optical system is configured to:
    direct radiation from spectrally dispersed first portions of the pupil plane field distribution having the first polarization onto a first sub-portion of the first array of lenses;
    direct radiation from spectrally dispersed first portions of the pupil plane field distribution having the second polarization onto a second sub-portion of the first array of lenses;
    direct radiation from spectrally dispersed second portions of the pupil plane field distribution having the first polarization onto a first sub-portion of the second array of lenses; and
    direct radiation from spectrally dispersed second portions of the pupil plane field distribution having the second polarization onto a second sub-portion of the second array of lenses.

13. The apparatus of clause 12, further comprising a polarization rotation device configured to:
    rotate the polarization of radiation incident on the first dispersive element so that the polarization is aligned with a direction of highest diffraction efficiency of the first dispersive element; and
    rotate the polarization of radiation incident on the second dispersive element so that the polarization is aligned with a direction of highest diffraction efficiency of the second dispersive element.

14. The apparatus of any preceding clause, wherein each of the first dispersive element and the second dispersive element comprises a diffraction grating or prism.

15. A metrology apparatus for measuring a structure formed on a substrate by a lithographic apparatus comprising:
    an optical system configured to illuminate the structure with radiation and detect radiation scattered by the structure, the optical system comprising:
    a beam rotation device configured to rotate at least a portion of a beam of the scattered radiation between a first pupil plane and a second pupil plane, the rotation being such that:
        a first pupil plane field distribution in the first pupil plane comprises a first portion and a second portion, wherein the first portion is non-overlapping with the second portion and the first portion has the same shape and size as the second portion; and
        a second pupil plane field distribution in the second pupil plane comprises a portion having the same shape and size as the first portion of the first pupil plane field distribution, wherein all of the radiation from the first portion and the second portion of the first pupil plane field distribution passes through said portion of the second pupil plane field distribution.

16. The apparatus of clause 15, wherein the beam rotation device is configured to:
    rotate a first portion of the beam of scattered radiation such that the first portion of the first pupil plane field distribution is rotated by a first amount in a first sense; and
    rotate a second portion of the beam of scattered radiation such that the second portion of the first pupil plane field distribution is rotated by the first amount in a second sense, the second sense being opposite to the first sense.

17. A lithographic system comprising:
    a lithographic apparatus configured to perform a lithographic process; and
    the metrology apparatus of any preceding clause, wherein:
    the lithographic apparatus is arranged to use the result of a measurement by the metrology apparatus of a structure formed by the lithographic process when performing a subsequent lithographic process.

18. A method of measuring a structure formed on a substrate by a lithographic process, comprising:
    illuminating the structure with radiation to produce scattered radiation from the structure;
    using a first dispersive element to spectrally disperse scattered radiation exclusively from a first portion of a pupil plane field distribution along a first dispersion direction; and
    using a second dispersive element, separated from the first dispersive element, to spectrally disperse scattered radiation exclusively from a second portion of the pupil plane field distribution, different from the first portion of the pupil plane field distribution, along a second dispersion direction; and
    detecting radiation from the dispersed first portions of the pupil plane field distribution and from the dispersed second portions of the pupil plane field distribution.

19. The method of clause 18, wherein the first dispersion direction is opposite to the second dispersion direction relative to the field distribution in the pupil plane.

20. The method of clause 18 or 19, wherein the first dispersion direction and the second dispersion direction are parallel to a line of mirror symmetry of the first portion and to a line of mirror symmetry of the second portion.

21. The method of any of clauses 18-20, wherein the scattered radiation from the spectrally dispersed first portions is directed onto a first array of lenses and the scattered radiation from the spectrally dispersed second portions is directed onto a second array of lenses.

22. The method of clause 21, wherein the first array of lenses focus radiation onto a first detector and the second array of lenses focus radiation onto a second detector.

23. The method of clause 21 or 22, wherein:
    the first array of lenses is located in a plane in which the spectrally dispersed first portions of the pupil plane field distribution are formed and the second array of lenses is located in a plane in which the spectrally dispersed second portions of the pupil plane field distribution are formed.

24. The method of clause 23, wherein the first dispersive element and the first array of lenses are arranged relative to the second dispersive element and the second array of lenses such that the spectrally dispersed first portions of the pupil plane field distribution formed in the plane of the first array of lenses are mirror symmetric about two orthogonal planes of symmetry with the spectrally dispersed second portions of the pupil plane field distribution formed in the plane of the second array of lenses.

25. The method of any of clauses 18-24, wherein a beam rotation device rotates the pupil plane field distribution by a predetermined angle before radiation from the first portion of the pupil plane field distribution is directed onto the first dispersive element and before radiation from the second portion of the pupil plane field distribution is directed onto the second dispersive element.

26. The method of clause 25, wherein the predetermined angle is such that the first dispersion direction and the second dispersion direction are parallel to a line of mirror symmetry of the first portion and to a line of mirror symmetry of the second portion.

27. The method of any of clauses 18-26, wherein:
when the structure comprises a grating, the first portion of the pupil plane field distribution and the second portion of the pupil plane field distribution respectively contain equal and opposite diffraction orders from the grating.

28. The method of any of clauses 18-27, further comprising splitting each of scattered radiation from the first portion of the pupil plane field distribution and scattered radiation from the second portion of the pupil plane field distribution into radiation having a first polarization and radiation having a second polarization.

29. The method of clause 28, wherein:
radiation from spectrally dispersed first portions of the pupil plane field distribution having the first polarization is directed onto a first sub-portion of the first array of lenses;
radiation from spectrally dispersed first portions of the pupil plane field distribution having the second polarization is directed onto a second sub-portion of the first array of lenses;
radiation from spectrally dispersed second portions of the pupil plane field distribution having the first polarization is directed onto a first sub-portion of the second array of lenses; and
radiation from spectrally dispersed second portions of the pupil plane field distribution having the second polarization is directed onto a second sub-portion of the second array of lenses.

30. The method of clause 29, further comprising:
rotating the polarization of radiation incident on the first dispersive element so that the polarization is aligned with a direction of highest diffraction efficiency of the first dispersive element; and
rotating the polarization of radiation incident on the second dispersive element so that the polarization is aligned with a direction of highest diffraction efficiency of the second dispersive element.

31. The method of any of clauses 18-30, wherein each of the first dispersive element and the second dispersive element comprises a diffraction grating or prism.

32. A method of measuring a structure formed on a substrate by a lithographic apparatus comprising:
illuminating the structure with radiation to produce scattered radiation from the structure;
rotating at least a portion of a beam of the scattered radiation between a first pupil plane and a second pupil plane, the rotation being such that:
a first pupil plane field distribution in the first pupil plane comprises a first portion and a second portion, wherein the first portion is non-overlapping with the second portion and the first portion has the same shape and size as the second portion; and
a second pupil plane field distribution in the second pupil plane comprises a portion having the same shape and size as the first portion of the first pupil plane field distribution, wherein all of the radiation from the first portion and the second portion of the first pupil plane field distribution passes through said portion of the second pupil plane field distribution.

33. The method of clause 32, wherein the rotation comprises:
rotating a first portion of the beam of scattered radiation such that the first portion of the first pupil plane field distribution is rotated by a first amount in a first sense; and
rotating a second portion of the beam of scattered radiation such that the second portion of the first pupil plane field distribution is rotated by the first amount in a second sense, the second sense being opposite to the first sense.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A metrology apparatus comprising:
an optical system configured to illuminate a structure formed on a substrate with radiation and to detect a first scattered radiation associated with a first portion of a pupil plane distribution and a second scattered radiation associated with a second portion of the pupil plane distribution, wherein the first and second scattered radiation are scattered by the structure and the optical system comprises:
a first dispersive element configured to spectrally disperse the first scattered radiation along a first dispersion direction; and
a second dispersive element, different than the first dispersive element, configured to spectrally disperse the second scattered radiation along a second dispersion direction,
wherein the first dispersion direction and the second dispersion direction are parallel to a line of mirror symmetry of the first portion and to a line of mirror symmetry of the second portion.

2. The apparatus of claim 1, wherein the first dispersion direction is opposite to the second dispersion direction relative to the pupil plane field distribution.

3. The apparatus of claim 1, wherein the optical system is further configured to direct the first and second scattered radiation onto respective first and second arrays of lenses.

4. The apparatus of claim 3, wherein the first array of lenses is configured to focus the first scattered radiation onto a first detector and the second array of lenses is configured to focus the second scattered radiation onto a second detector.

5. The apparatus of claim 3, wherein:
the first array of lenses is located in a plane in which the first scattered radiation is formed; and
the second array of lenses is located in a plane in which the second scattered radiation is formed.

6. The apparatus of claim 5, wherein:
the first dispersive element and the first array of lenses are arranged relative to the second dispersive element and the second array of lenses such that the first scattered radiation is mirror symmetric with the second scattered radiation about two orthogonal planes of symmetry.

7. The apparatus of claim 1, wherein the optical system further comprises a beam rotation device configured to rotate the pupil plane field distribution by a predetermined angle before directing the first scattered radiation onto the first dispersive element and the second scattered radiation onto the second dispersive element.

8. The apparatus of claim 7, wherein the predetermined angle is such that the first dispersion direction and the second dispersion direction are parallel to the line of mirror symmetry of the first portion and to the line of mirror symmetry of the second portion.

9. The apparatus of claim 1, wherein the optical system is further configured such that, when the structure comprises a grating, the first portion of the pupil plane field distribution and the second portion of the pupil plane field distribution respectively contain equal and opposite diffraction orders from the grating.

10. The apparatus of claim 1, further comprising a polarization dependent beam splitter configured to split each of the first scattered radiation and the second scattered radiation into radiation having a first polarization and radiation having a second polarization.

11. The apparatus of claim 10, wherein the optical system is further configured to:
direct the first scattered radiation having the first polarization onto a first sub-portion of a first array of lenses;
direct the first scattered radiation having the second polarization onto a second sub-portion of the first array of lenses;
direct the second scattered radiation having the first polarization onto a first sub-portion of a second array of lenses; and
direct the second scattered radiation having the second polarization onto a second sub-portion of the second array of lenses.

12. The apparatus of claim 10, further comprising a polarization rotation device configured to:
rotate the first polarization of radiation incident on the first dispersive element so that the first polarization is aligned with a direction of highest diffraction efficiency of the first dispersive element; and
rotate the second polarization of radiation incident on the second dispersive element so that the second polarization is aligned with a direction of highest diffraction efficiency of the second dispersive element.

13. The metrology apparatus of claim 1, wherein the first and second dispersive elements each comprises a diffraction grating or prism.

14. A lithographic system comprising:
a lithographic apparatus configured to perform a lithographic process; and
a metrology apparatus comprising:
an optical system configured to illuminate a structure formed on a substrate with radiation and to detect a first scattered radiation associated with a first portion of a pupil plane distribution and a second scattered radiation associated with a second portion of the pupil plane distribution, wherein the first and second scattered radiation are scattered by the structure and the optical system comprises:
a first dispersive element configured to spectrally disperse the first scattered radiation along a first dispersion direction; and
a second dispersive element, different than the first dispersive element, configured to spectrally disperse the second scattered radiation along a second dispersion direction,
wherein the optical system is further configured to direct the first and second scattered radiation onto respective first and second arrays of lenses, and
wherein the lithographic apparatus is arranged to use a result of a measurement by the metrology apparatus of the structure formed by the lithographic process when performing a subsequent lithographic process.

15. The lithographic system of claim 14, wherein the first and second dispersive elements each comprises a diffraction grating or prism.

16. A method of measuring a structure formed on a substrate by a lithographic process, the method comprising:
illuminating the structure with radiation to produce first and second scattered radiation from the structure, wherein the first scattered radiation is associated with a first portion of a pupil plane distribution and the second scattered radiation is associated with a second portion of the pupil plane distribution;
spectrally dispersing the first and second scattered radiation along respective first and second dispersion directions using respective first and second dispersive elements;
directing the first and second scattered radiation onto respective first and second arrays of lenses; and
detecting the spectrally dispersed first and second scattered radiation.

17. The method of claim 16, wherein the first dispersion direction is opposite to the second dispersion direction relative to the field distribution in the pupil plane.

18. The method of claim 16, wherein the first dispersion direction and the second dispersion direction are parallel to a line of mirror symmetry of the first portion and to a line of mirror symmetry of the second portion.

19. The method of claim 16, further comprising focusing the first and second scattered radiation onto respective first and second detectors.

20. The lithographic system of claim 16, wherein the spectrally dispersing comprises spectrally dispersing the first and second scattered radiation along respective first and second dispersion directions using respective first and second gratings or first and second prisms.

* * * * *